United States Patent [19]
Kundert

[11] Patent Number: 5,610,847
[45] Date of Patent: Mar. 11, 1997

[54] RATIOMETRIC FOURIER ANALYZER

[75] Inventor: Kenneth S. Kundert, Belmont, Calif.

[73] Assignee: Cadence Design Systems, Inc., San Jose, Calif.

[21] Appl. No.: 331,186

[22] Filed: Oct. 28, 1994

[51] Int. Cl.[6] .................................................. G06G 7/19
[52] U.S. Cl. .................... 364/576; 364/577; 364/484; 364/485; 364/487; 324/76.19; 324/76.21; 324/76.38; 324/608
[58] Field of Search ........................... 364/576, 484–487, 364/577; 324/76.19, 76.21, 76.24, 76.22, 76.38, 76.39, 76.41, 76.42, 76.58, 605, 608, 612–614, 681

[56] References Cited

U.S. PATENT DOCUMENTS

| | | | |
|---|---|---|---|
| 4,689,754 | 8/1987 | Collins et al. | 364/577 |
| 4,689,759 | 8/1987 | Anovar et al. | 364/577 |
| 4,818,949 | 4/1989 | Cohen | 324/76.21 |
| 4,832,480 | 5/1989 | Kornacher et al. | 351/246 |
| 5,016,202 | 5/1991 | Seibel et al. | 364/577 |
| 5,065,334 | 11/1991 | Taylor et al. | 364/485 |
| 5,400,261 | 3/1995 | Reynold | 364/487 |
| 5,412,985 | 5/1995 | Garcia et al. | 73/460 |
| 5,420,516 | 5/1995 | Cabot | 364/576 |

FOREIGN PATENT DOCUMENTS

| | | | |
|---|---|---|---|
| 0399704A2 | 5/1990 | European Pat. Off. | G01R 23/165 |
| 0543139A1 | 10/1992 | European Pat. Off. | G01R 29/02 |

*Primary Examiner*—Emanuel T. Voeltz
*Assistant Examiner*—Hal D. Wachsman
*Attorney, Agent, or Firm*—Leo V. Novakoski; John T. McNelis; Fenwick & West LLP

[57] ABSTRACT

A ratiometric Fourier analyzer is provided for determining the frequency components of the output waveforms of electronic circuits by eliminating errors due to aliasing without increasing the time necessary for analysis. Ratiometric Fourier analyzers in accordance with the present invention detect values of an output waveform from a circuit simulator at time intervals selected according to features of the output waveform being analyzed. A functional representation of the output waveform over each interval is generated using a polynomial fit to the detected values of the waveform, and a Fourier integral for each frequency of interest is calculated for interval using the functional representation of the waveform. The Fourier integrals are then summed over the intervals of the output waveform to yield the Fourier coefficient at a given frequency for the output waveform. The accuracy and efficiency of the method are enhanced by employing polynomial fitting procedures to the same order in both the Fourier analyzer and the simulator and by selecting the sampling points of the Fourier analyzer at the same time steps used by the simulator to generate the output waveform. The RFA can be used to determine a small number of harmonics in a broadband signal without distortion due to aliasing.

17 Claims, 7 Drawing Sheets

RATIOMETRIC FOURIER ANALYZER

BACKGROUND OF THE INVENTION

1. Field of the Invention

The present invention is a method and apparatus for determining the frequency components of a waveform that is sampled at a discrete set of times, and more particularly, for determining the Fourier coefficients of the output waveform of a circuit or a simulator, based on samples of the output waveform taken at selected time intervals.

2. Related Art

In order to characterize the behavior of circuits and electronic systems, it is often useful to analyze the frequency components of the output waveform that is generated by the circuit or electronic system. The output waveform may be generated by an actual circuit or electronic system, but more typically it is generated by a circuit simulator. Typically, the simulator is driven by a reference signal at a fundamental frequency and the amplitudes of the various harmonic frequencies in the output waveform are identified by means of Fourier analysis, whereby the time-dependent output waveform of the circuit or system is transformed into a frequency-domain function. The amplitude of the frequency domain function at a given frequency indicates the relative contribution of the frequency to the output waveform. The results of Fourier analysis are typically represented as a series of Fourier coefficients, the magnitudes of which indicate the distribution of energy in the output waveform among the fundamental and harmonic frequencies.

Conventional Fourier analyzers typically detect the actual or simulated output waveform at uniform time intervals, (the sampling rate) and the integral transforth that relates the Fourier coefficient to the detected output waveform is approximated by a discrete Fourier series. The terms of this Fourier series are determined for each time interval using a representative value of the output waveform for the interval and summing each term in the series.

Accurate analysis of the frequency components of an output waveform requires careful selection of the sampling rate, since this rate limits the frequency components that can be resolved in a Fourier analysis. The highest frequency component of a waveform that can be accurately resolved by sampling the waveform every $\Delta$ seconds is $(2\Delta)^{-1}$. Frequency components falling outside the range $\pm(2\Delta)^{-1}$ vary too quickly to be accurately resolved by sampling every $\Delta$ seconds. Instead, the energy in these frequency components is added to Fourier coefficients of frequency components within the range. The resulting distortion of the Fourier coefficients is referred to as aliasing and is a major source of errors in the Fourier analysis of broad band output waveforms. For this reason, the sampling rate must be selected so that all frequency components having substantial amplitude in the output waveform fall within the frequency range, $\pm(2\Delta)^{-1}$. This is a particularly burdensome requirement for output waveforms having broad frequency bands.

Even where the sampling rate is sufficiently fast to resolve substantially all frequency components in an output waveform, discontinuous artifacts in the waveforms generate error components across a broad band of frequencies. Aliasing couples the errors at frequencies outside the range, $\pm(2\Delta)^{-1}$, into the Fourier coefficients of frequencies within the range. Such error producing discontinuities arise, for example, where an output waveform has not completely settled between analysis cycles, where the wrong period is used for the waveform, or where the waveform computed by a simulator is not completely converged.

Errors in Fourier coefficients may also be introduced through the interpolation method used by a simulator to compute the output waveform. Particularly where the simulator employs a low order interpolation scheme, the time step between adjacent points of the simulated output waveform must be sufficiently small to keep errors in the interpolated output waveform within selected limits. However, small time steps are unnecessary for analyzing the relatively flat portions of the output waveform, and the selected time step typically represents a trade off between accuracy and efficiency in computing the output waveform.

SUMMARY OF THE INVENTION

The present invention is a ratiometric Fourier analyzer that resolves the frequency components of an output waveform with increased accuracy and efficiency. The Fourier analyzer of the present invention eliminates errors due to aliasing without increasing the time necessary for analysis. In addition, the rate at which the waveform is sampled varies according to the properties of the output waveform, allowing the Fourier analyzer to sample the output waveform more or less frequently, as required. The ratiometric Fourier analyzer optionally provides a channel for Fourier analyzing the signal that drives the circuit or simulator to generate a reference waveform for checking the accuracy of the analyzer. By normalizing the Fourier coefficients of the output waveform to the amplitude of the fundamental frequency of the reference signal, large signal transfer functions and immitances of the circuit can be computed.

A Ratiometric Fourier analyzer in accordance with the present invention comprises a detector having an input for detecting values of an ouptut waveform at selected times and a processor having a memory that includes a control program. Modules within the control program determine the duration of the selected intervals for detecting values of the output waveform, generate a representation of the output waveform from the detected values, determine a Fourier integral over each interval, and calculate a Fourier coefficient from the Fourier integrals.

The ratiometric Fourier analyzer in accordance with the present invention detects values of an output waveform from a circuit or a system simulator at time intervals selected according to features of the output waveform being analyzed. A functional representation of the output waveform over each of the selected intervals is generated by a module of the control program from the detected values of the output waveform, and a Fourier integral for each frequency of interest is calculated by another module of the control program over the selected interval using this functional representation. The Fourier integrals are then summed over the intervals of the output waveform by a module of the control program to yield the Fourier coefficient at a given frequency for the output waveform. Typically, Fourier coefficients of the output waveform are calculated at the fundamental frequency and for various harmonics of the fundamental frequency.

In a preferred embodiment of the invention, the functional representation of the output waveform is generated by a processor implemented polynomial fitting procedure. Where the output waveform is provided by a simulator, the accuracy of the method may be further improved by employing polynomial fitting procedures to the same order in both the Fourier analyzer and the simulator. The accuracy and efficiency of the method may also be enhanced by selecting the sampling points of the Fourier analyzer at the same time steps used by the simulator to generate the output waveform.

DETAILED DESCRIPTION OF THE INVENTION

Figure 1A:
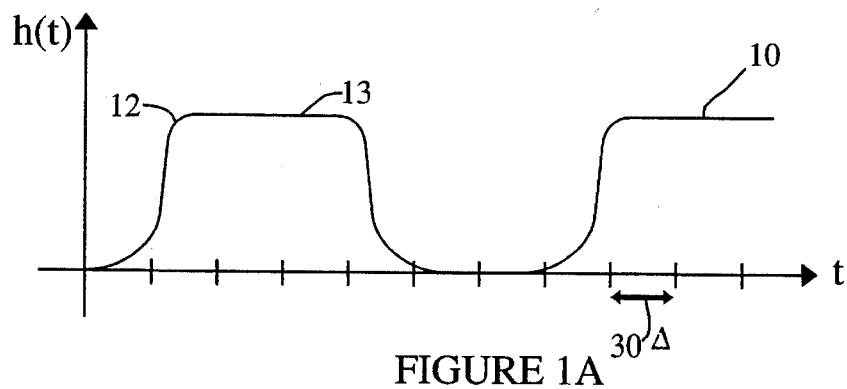
FIG. 1A–C are schematic representation of the output of a conventional Fourier analyzer, exhibiting the effects of aliasing.

Referring to FIG. 1A, there is shown an output waveform 10 (h(t)) representing an output signal from a circuit or a simulator plotted as a function of time. The sharp curvature of waveform 10 near point 12 indicates that a Fourier transform of output waveform 10 will include contributions from high frequencies. On the other hand, the relative flatness of waveform 10 near point 13 indicates that low frequencies will also be present in the Fourier transform of output waveform 10. Thus, the Fourier transform of output waveform 10 will have non-zero amplitude over a broad range of frequencies.

Figure 1B:
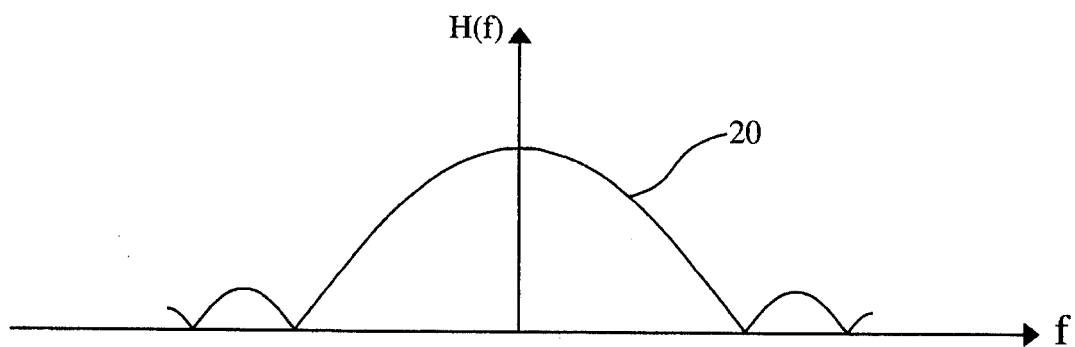

Referring now to FIG. 1B, there is shown an accurate Fourier transform 20 of output waveform 10. Formally, Fourier transform 20 is obtained from output waveform 10 by means of a Fourier transform integral:

$$H(f) = \int h(t) e^{(2\pi i f t)} dt. \quad \text{(Eq.1)}$$

Here, h(t) corresponds to output waveform 10 and H(f) corresponds to Fourier transform 20 of output waveform 10.

Conventional Fourier analyzers approximate the integral transform of Eq. 1 with a discrete summation. This discrete Fourier transform (DFT) procedure may yield reasonably accurate results provided the summation is done over finely divided time intervals. In practice, this means that output waveform 10 must be sampled at a high sampling rate. Since high sampling rates increase the time necessary to analyze a waveform, conventional DFT Fourier analyzers typically sample output waveforms at the lowest rate that does not introduce aliasing.

For example, a conventional DFT Fourier transform analyzer analyzes waveform 10 at equal time intervals 30, each having a length, $\Delta$, equal to the inverse of the selected sampling rate. Within each time interval 30, for example at time $t_k$ in the $k^{th}$ interval, a value, $h_{(t_k)}$, representative of waveform 10 in the $k^{th}$ interval is multiplied by a factor $\exp(2\pi i f_j t_k)$ for each frequency $f_j$ of interest. The products are summed over all intervals 30 and multiplied by the uniform width $\Delta$ of intervals 30 to yield the Fourier coefficient, $H_j$, for the frequency, $f_j$.

$$H_j = \Delta \Sigma h(t_k) \exp(2\pi i f_j t_k). \quad \text{(Eq. 2)}$$

Typically, the frequencies analyzed are the frequency of the signal that drives the circuit or simulator (fundamental) and its harmonic frequencies.

Aliasing arises in this discrete Fourier transform method when frequency components of waveform 10 fall outside a frequency range that is determined by the sampling interval $\Delta$. This frequency range includes frequencies having absolute values between $f_N = (2\Delta)^{-1}$, where negative frequency components are the complex conjugates of positive frequency components. The Fourier amplitudes of any frequencies outside the range, $\pm f_N$, that contribute to output waveform 10 are folded back and added to the amplitudes of frequencies within this range, $\pm f_N$.

Figure 1C:
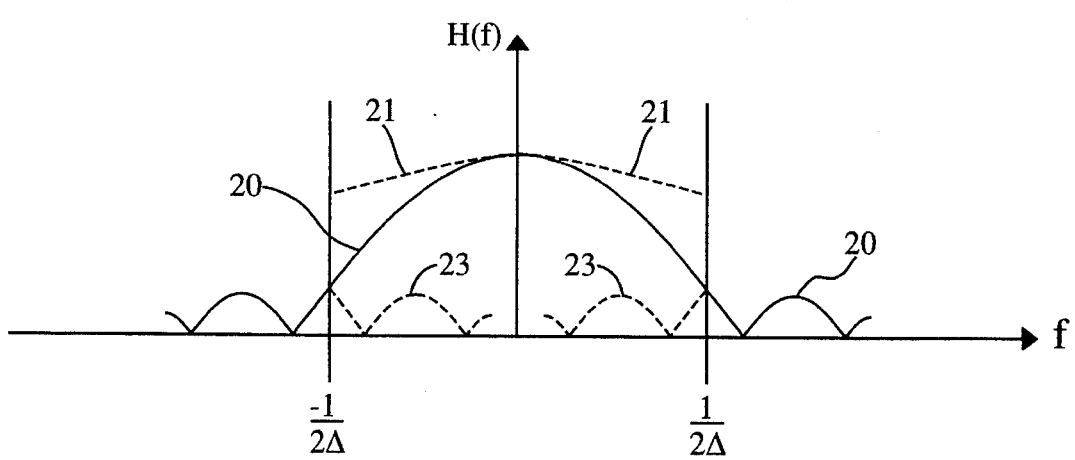

Referring now to FIG. 1C, there is shown a Fourier transform 21 of output waveform 10 computed by means of Eq. 1, where the width $\Delta$ of time intervals 30 is too broad to resolve all significant frequency components of output waveform 10. As a result, significant frequency components exist outside the range $\pm(2\Delta)^{-1}$ and computed Fourier transform 21 is distorted by alias components 23. Also shown for reference is accurate Fourier transform 20 computed using a shorter time step $\Delta$. The distortion of computed Fourier transform 21 due to alias 23 is indicated by the greater amplitude of computed Fourier transform 21 relative to Fourier transform 20 at frequencies just within the range, $\pm f_N$, and the absence of contributions to computed Fourier transform 21 from frequencies outside this range.

Even where intervals 30 are selected to be sufficiently short for the frequency components of output waveform 10, errors may be introduced by discontinuities in output waveform 10. Such discontinuities arise when waveform 10 is not exactly periodic due to circuit settling behavior or when the period designated for the reference signal is incorrect. In either case, discontinuities introduce a broad band of frequency components which are likely to exceed the range, $\pm(2\Delta)^{-1}$. In addition, approximating output waveform 10 over an interval 30 by a fitting function contributes an interpolation error to Fourier coefficients calculated by means of Eq. 2.

Figure 2A:
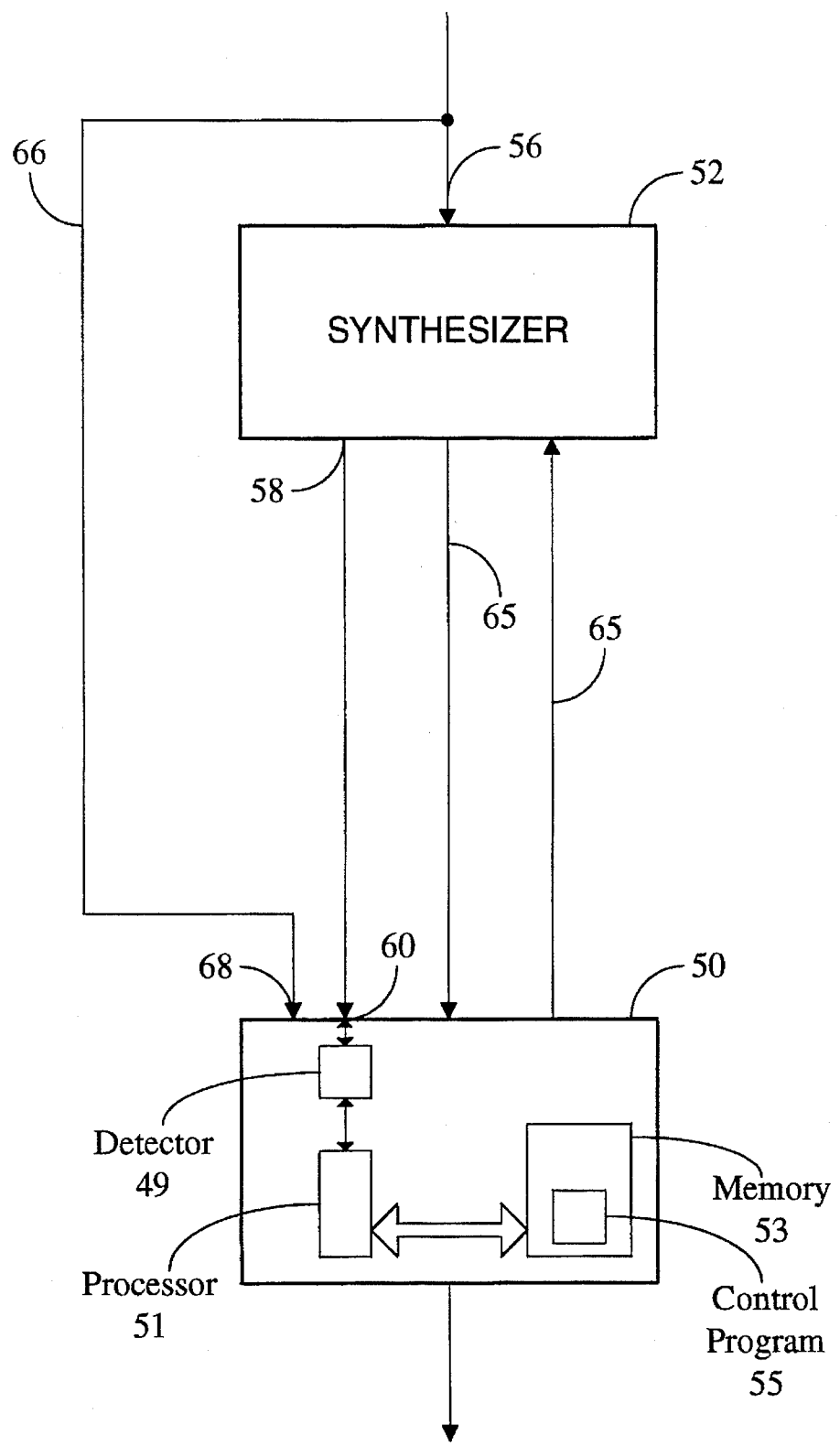
FIGS. 2A and 2B are schematic representations of a ratiometric Fourier analyzer in accordance with the present invention, interacting with a circuit and a system simulator, respectively.

Referring now to FIG. 2A, there is shown a schematic representation of a ratiometric Fourier analyzer (RFA) 50 in accordance with the present invention. RFA 50 is shown connected to a simulator 52 which may be programmed to provide output waveforms 10 representative of a wide variety of electronic circuits and systems. RFA 50 further comprises a detector 49 and a processor 51 coupled to a memory 53 in which a control program 55 is stored. Control program 55 controls the detection and analysis of an output waveform 10 as discussed below in conjunction with FIG. 3.

A driving signal 54 is applied to an input 56 of simulator 52 and an output waveform 10 generated by driving signal 54 is coupled from an output 58 of simulator 52 to an input 60 of RFA 50. A control line 64 couples analyzer information, such as the desired fundamental frequency of the analysis, the order of interpolation used by the simulator, and the location of break points, from simulator 52 to RFA 50. A feedback signal line 64 couples information from RFA 50 back to simulator 52 and may be used, for example, to trigger simulator 52 to provide a new data point or to bound the time step. A reference signal line 66 couples driving signal 54 to a second input 68 of RFA 50 so that driving signal 54 may be analyzed by RFA 50 for signal calibration and normalization purposes. For example, where driving signal 54 is a pure sinusoidal signal, it should have a non-zero Fourier coefficient only for the fundamental frequency and zero Fourier coefficients for all other frequencies. Deviations from this result provide a measure of the performance of RFA 50. In addition, the Fourier coefficient of reference signal 54 may be used to determine the gain or immitance as a function of frequency for waveform 10.

Figure 2B:
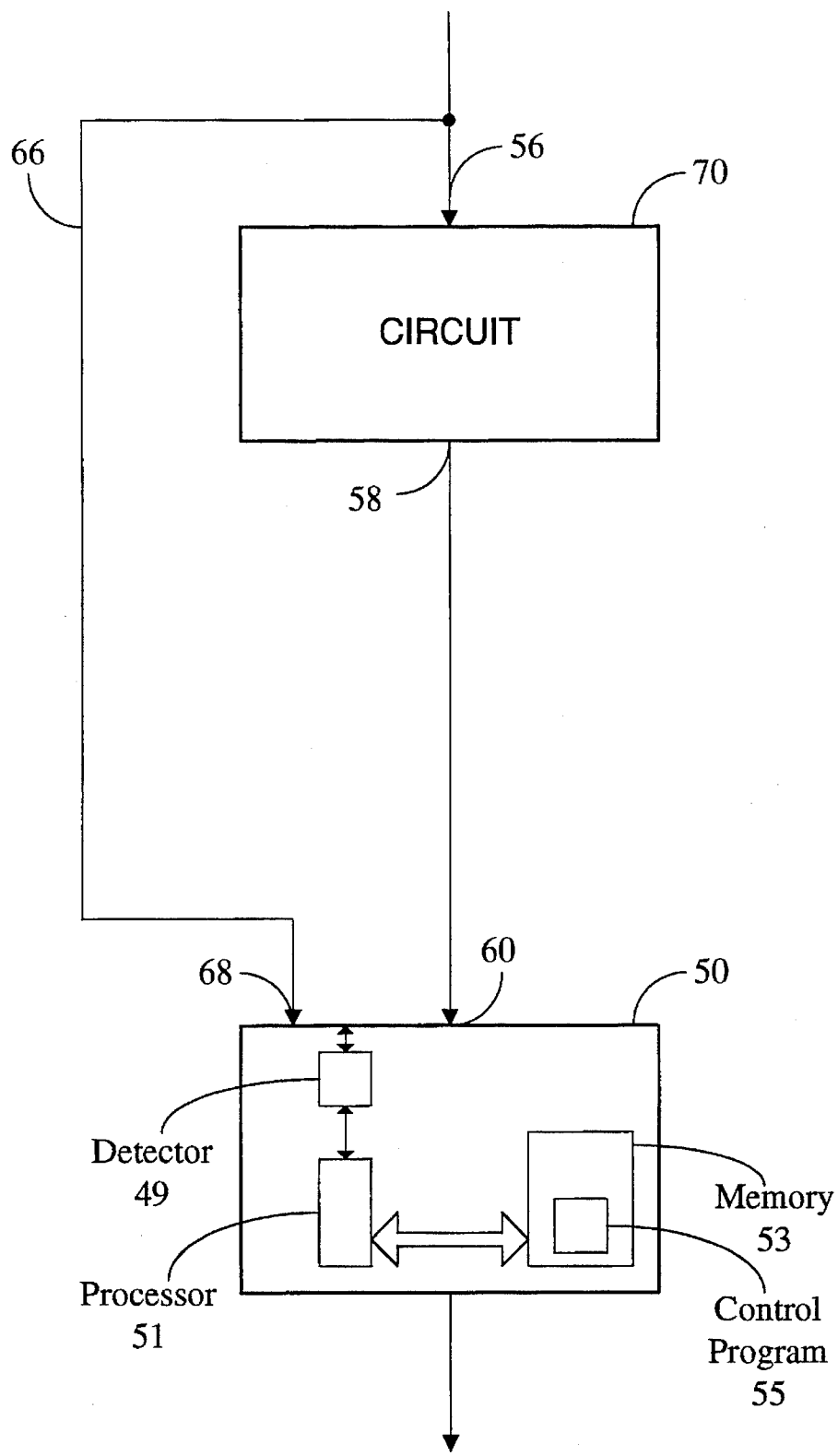

Referring now to FIG. 2B, there is shown a schematic diagram in which RFA 50 is connected to receive an output waveform 10 of an actual circuit or electronic system 70. The major difference between the configurations of FIG. 3B and 3A is that feedback signal line 64 is not present in FIG. 3B since electronic system 70 provides a continuous output waveform 10 without triggering by RFA 50.

Figure 3:
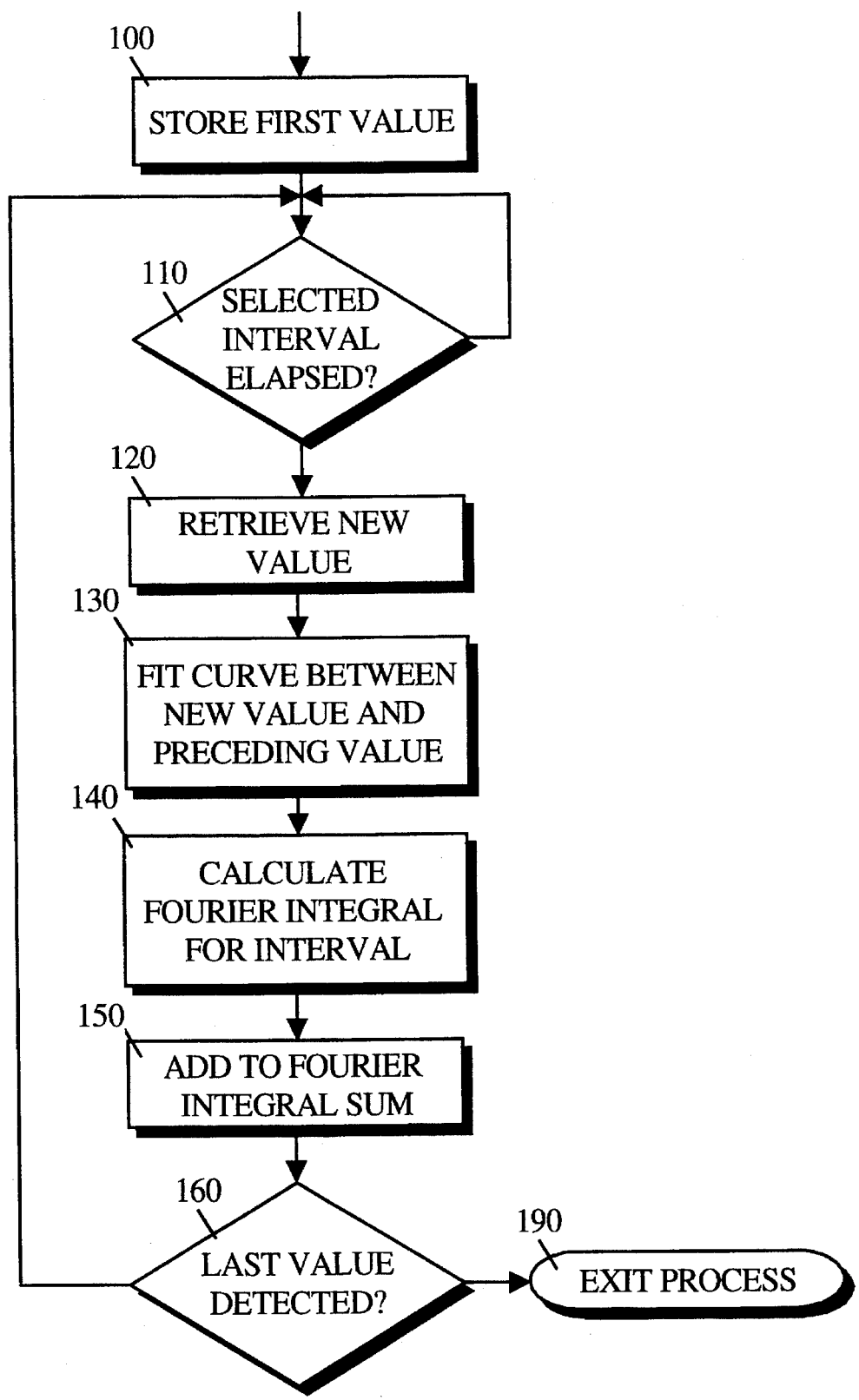
FIG. 3 is a flow chart representing the method of the present invention.

Referring now to FIG. 3, there is shown a flow chart representing a method 90 implemented by control program 55 operating in conjunction with processor 51 of RFA 50 to analyze output waveforms 10. The flow chart of FIG. 3 is applicable to waveforms 10 whether they are produced by a simulator 52 or an actual electronic system 70. Process 90 begins when an initial value of output waveform 10 is detected 100 at input 60 of RFA 50. Process 90 then waits 110 until a selected interval has passed, at which time a new value of output waveform 10 is retrieved. Procedures for selecting the duration of the wait between retrieval of new values for output waveform 10 are discussed below.

The new value of output waveform 10 is combined with previous values of waveform 10 to generate 130 a functional representation of output waveform 10 between the new value and the preceding value by a curve fitting procedure. The functional representation of output waveform 10 is then used to compute 140 a Fourier integral over the selected interval between the previous and present value of output waveform 10 for each frequency of interest. Use of a functional representation of waveform 10 in the selected interval allows the Fourier integral to be evaluated analytically, eliminating the aliasing problem that arises in discrete Fourier analysis. The computed Fourier integral is then added 150 to the Fourier integrals calculated for the same frequency over previous intervals of output waveform 10.

If the new value is not the last value of output waveform 10, i.e. if output waveform 10 has not been sampled over a full period, T, process 90 branches 160 to wait 110 for the next value of output waveform 10. Otherwise, RFA exits 190 process 90. The details of each of steps 110–190 are discussed below.

The duration of wait 110 may be based on a variety of criteria. For example, the selected intervals between retrieving 120 a new value of output waveform 10 may be uniform, with their duration determined by the expected frequency bandwidth of output waveform 10 or by the period, T, of waveform 10. However, the use of uniform intervals imposes substantial trade-offs between accuracy and efficiency, since short time intervals (high sampling rates) are necessary to accurately transform sections of output waveform 10 having large curvatures (second derivatives) but are unnecessarily short for relatively flat sections of output waveform 10.

In a more preferred embodiment of the present invention, the duration of the selected interval varies according to the behavior of output waveform 10. For example, when output waveform 10 is provided by simulator 52, process 90 waits 110 until simulator 52 computes a new value for output waveform 10. In this case, the selected interval is determined by simulator 52, which computes values for output waveform 10 at shorter intervals as the curvature of output waveform 10 increases and at longer intervals as the curvature of output waveform 10 decreases. For this purpose, simulator 52 may employ error criteria in which the selected interval between calculated values of output waveform 10 decreases as the rate of variation in the values increases. In this case, process 90 waits 110 until a new value is coupled to RFA 50 from output 58 of simulator 52. This method of selecting intervals has the advantage that curve fitting in simulator 52 and RFA 50 can be done to the same level of accuracy without sacrificing efficiency.

In an alternative embodiment of process 90 that is suitable for use with actual circuits or systems 70, RFA 50 can monitor output waveform 10 and exit state 110 when a triggering feature of output waveform 10 is detected. For example, since the accuracy of a curve interpolation scheme employed in a fitting step 130 depends on the curvature of output waveform 10, RFA 50 can monitor the second derivative of output waveform 10 and exit wait state 110 at a point determined by the second derivative of output waveform 10. In this case, process 90 is effectively doing the analysis done by simulator 52 in the embodiment described above.

Once process 90 reaches the end of the selected interval, the new value of waveform 10 at input 60 of RFA 50 is retrieved 120. The new value of waveform 10 is used along with previously detected values to fit 130 a functional representation to output waveform 10 in the selected interval between the time the new value at input 60 is retrieved 120 and the time the previous value was retrieved 120.

In a preferred embodiment of the present invention, a polynomial fit is employed to represent output waveform 10 in the selected interval. For example, letting $s_n$ represent the new value of waveform 10 detected at time $t_n$ and $s_{n-1}$, $s_{n-2}$, $s_{n-3}$, ... represent previous values of waveform 10 detected at times $t_{n-1}$, $t_{n-2}$, $t_{n-3}$, ..., respectively, waveform 10 in the selected time interval between $t_n$ and $t_{n-1}$ (the $n^{th}$ interval), may be represented by:

$$S_n(\tau) = \sum_{m=0}^{M} c_{mn}\tau^m \quad \text{(Eq. 3)}$$

Here, $S(\tau)_n$, represents waveform 10 in the $n^{th}$ interval, $c_{mn}$ is the coefficient of the $m^{th}$ power of the time variable, $\tau$, in the polynomial expansion, and M is the order of the polynomial. Each coefficient, $c_{mn}$, is related to the value of output waveform 10 and its derivatives over the selected interval. The coefficients, $c_{mn}$, can be computed from the data points and times, $\{s_n, s_{n-1}, \ldots\}$ and $\{t_n, t_{n-1}, \ldots\}$, respectively, using any of a variety of well known algorithms.

Once $S(\tau)_n$ has been fitted 130 from data points $\{s_n, s_{n-1}, \ldots\}$ and times $\{t_n, t_{n-1}, \ldots\}$ a Fourier integral over the selected interval, $t_n$, $t_{n-1}$, is computed 140. The Fourier integral for a frequency, $f(k) = k\omega$, is given by:

$$FI_{n,k} = \frac{2}{T} \int S_n(\tau) \cos(k\omega\tau) d\tau = \quad \text{(Eq. 4)}$$

$$\frac{2}{T} \int \sum_{m=0}^{M} c_{mn}\tau^m \cos(k\omega\tau) d\tau = \sum_{m=0}^{M} c_{mn} \alpha_{km}(n)$$

$\alpha_{km}(n)$ is the analytically integrable integral, $2/T \int \tau^m \cos(k\omega\tau) d\tau$ over the interval $t_n - t_{n-1}$, and has the general form:

$$\alpha_{km}(n) = \left[ \sin(k\omega\tau) \sum_{i=0}^{\left[\frac{m}{2}\right]} (-1)^i \frac{m!}{(m-2i)!} \frac{\tau^{m-2i}}{(k\omega)^{2i+1}} + \right. \quad \text{(Eq. 5)}$$

-continued $$\cos(k\omega\tau) \left[ \sum_{i=0}^{\left[\frac{m-1}{2}\right]} (-1)^i \frac{m!}{(m-2i-1)!} \frac{\tau^{m-2i-1}}{(k\omega)^{2i+2}} \right]_{t_{n-1}}^{t_n}$$

Here, [m/2] indicates integer division by 2, i.e. [5/2]=2. Thus, the general form of $\alpha(n)_{km}$ may be calculated 140 for the start and endpoints, $t_n$, $t_{n-1}$ of each selected interval for each frequency of interest. The $FI_{n,k}$ computed 140 for each frequency are added 150 to the Fourier coefficient ($FC_k$) for the frequency which includes the $FI_{p,k}$ calculated for each preceding interval, p, at the frequency, kω. Use of the $FI_{n,k}$ in process 90 eliminates errors due to aliasing as well as errors introduced by approximating the integral of Eq. 4 with a discrete series.

At step 160 it is determined whether the last value of output waveform 10 has been detected. If not, process 90 repeats steps 110–150 for the next interval, n+1. If n is the last interval in waveform 10, process 90 is exited 190.

The resolution with which Fourier coefficients can be computed using the Fourier analyzer of the present invention may be demonstrated by examining the output waveform of a circuit in which harmonic distortion is expected to be minimal. For this purpose, a circuit having a near sinusoidal behavior is selected since the Fourier coefficients of the higher harmonics will be small and therefore difficult to detect.

TABLE 1

| Harmonic fundamental | SPICE2g6 875 mV | Spectre 1V | Harmonic Balance 1V |
|---|---|---|---|
| 2nd | −40.5 dB | −98.6 dB | −98.5 dB |
| 3rd | −43.2 dB | −116 dB | −120 dB |
| 4th | −24.3 dB | −125 dB | −169 dB |
| 5th | −33.3 dB | −124 dB | −143 dB |
| 6th | −33.3 dB | −125 dB | −196 dB |
| 7th | −24.3 dB | −125 dB | −165 dB |
| THD | 9.55% | .0012% | .0012% |

Referring now to Table 1, there is shown the results of a circuit simulation in which RFA 50 analyzed an output waveform 10 from simulator 52 of a low distortion µa741 operational amplifier in unity gain configuration. Simulator 52, a Spectre simulator, manufactured by Cadence Design Systems, Inc., was driven with a low frequency (1 kHz), low amplitude (1 Volt peak amplitude) driving signal 54 and the first nine harmonics of a 10 ms transient waveform 10 were determined. The second column of Table 1 shows results generated with a conventional discrete Fourier transform (DFT) analyzer provided with a SPICE2g6 simulator. The fourth column of Table 1 shows results generated by harmonic balance, a process that yields highly accurate results for low distortion waveforms. Accordingly, the harmonic balance results serve as a standard in this comparison.

The amplitudes of the fundamental frequency and the second through seventh harmonics were computed for each system. In addition, the total harmonic distortion (THD) is calculated and reported in the last row. As indicated by the harmonic balance results in the third column, the THD for the µa741 operational amplifier exhibits very little harmonic distortion.

A comparison of the second, third, and fourth columns indicates that the Fourier analysis done using the conventional Fourier analyzer of SPICE2g6 is substantially less accurate than the Fourier analysis done using either the RFA of the present invention or the harmonic balance method. For example, the present invention and the harmonic balance method indicate relative amplitudes of −124 dB and −143 dB, respectively, for the fifth harmonic while the DFA method indicates a relative amplitude of −33.3 dB. Similar discrepancies between the DFA based method of column 1 and the methods of columns 3 and 4 are present in the other harmonics and the fundamental.

TABLE 2

| Harmonic fundamental | SPICE2g6 997 mV | Spectre 1V | Harmonic Balance 1V |
|---|---|---|---|
| 2nd | −55.3 dB | −98.5 dB | −98.5 dB |
| 3rd | −58.1 dB | −120 dB | −120 dB |
| 4th | −53.3 dB | −159 dB | −169 dB |
| 5th | −55.9 dB | −142 dB | −143 dB |
| 6th | −55.9 dB | −164 dB | −196 dB |
| 7th | −53.3 dB | −165 dB | −165 dB |
| THD | 0.48% | 0.0012% | 0.0012% |

The fact that the noise limits in Table 1 are attributable to errors in the waveforms rather than to errors in the Fourier analysis methods is demonstrated with reference to Table 2. Table 2 includes comparable results for the case in which the waveforms were calculated to greater accuracy by setting more stringent limits on the errors tolerated when simulator 52 solves the Kirchoff circuit law. By coincidence, the number of intervals and the placement of the time points defining the intervals was not altered for the method of the present invention. Consequently, the accuracy of the Fourier analysis is substantially unchanged as indicated by the relative size of the amplitudes reported in columns 3 and 4. However, the noise floor does decrease to about −160 dB. The SPICE2g6 results on the other hand show a substantially larger shift as the waveforms are calculated with greater accuracy. However, the accuracy of the Fourier analysis done by the conventional (DFA) method remains substantially less than that of the method of the present invention.

The accuracy with which the Fourier components of a limited number of harmonics can be determined by the method of the present invention is demonstrated by analyzing the output signal of a ΣΔ modulator. Unlike the near sinusoidal output waveform of the µa741 operational amplifier discussed above, the output signal of a ΣΔ modulator is a long sequence of integers. The distortion of the ΣΔ modulator is determined by the value and order of these integers rather than the detailed shape of the waveform. For this reason, the accuracy of the analysis will be independent of the simulator, and an FFT analysis will be accurate as long as the analysis extends over a sufficiently broad frequency range.

Figure 4:
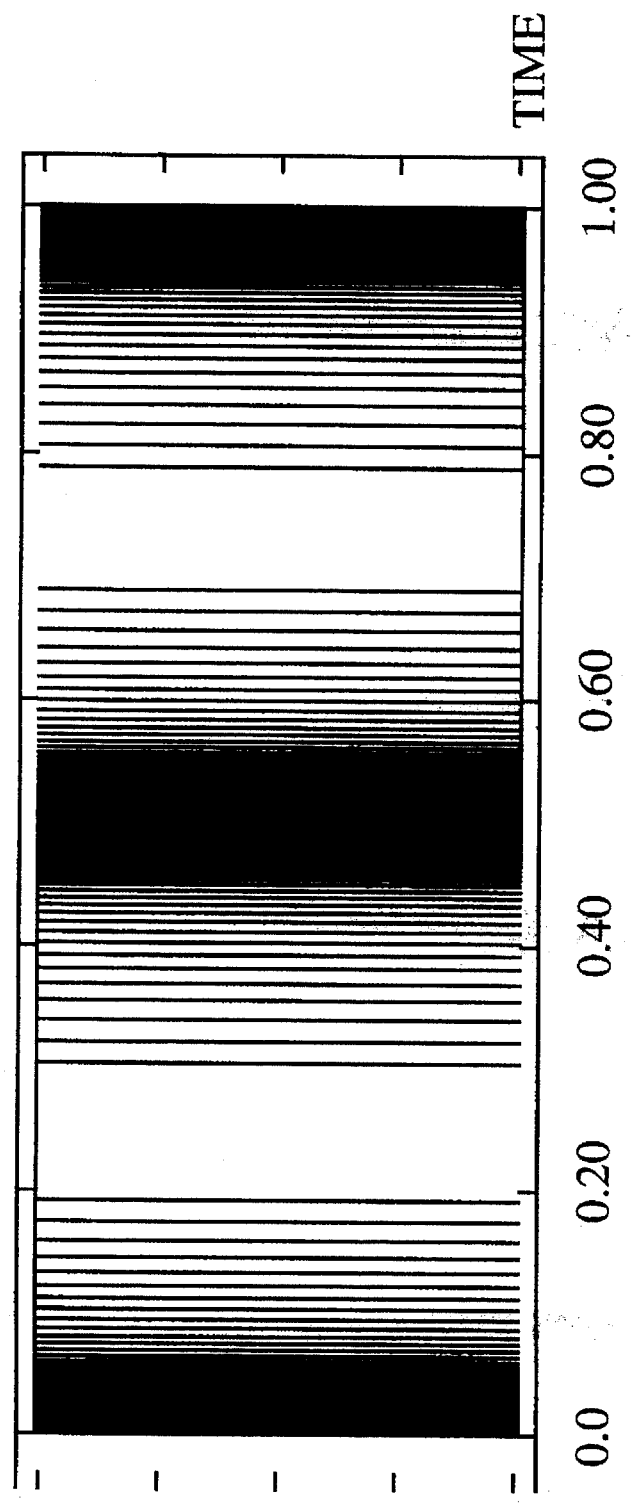
FIG. 4 is a schematic diagram of the frequency output of a sigma-delta modulator.

Referring now to FIG. 4 there is shown an output signal of a ΣΔ modulator. It can be seen from FIG. 4 that the output signal includes a broad band of frequencies. Consequently, if there are any aliasing problems they will be apparent when the Fourier coefficients of this broad band signal are determined using only some of the many harmonics present in the signal

TABLE 3

| Harmonic fundamental | Fourier Integral 1V | FFT 1V |
|---|---|---|
| 2nd | −63.3 dB | −63.3 dB |
| 3rd | −54.3 dB | −54.3 dB |
| 4th | −55.3 dB | −55.3 dB |
| 5th | −51.6 dB | −51.6 dB |
| 6th | −48.9 dB | −48.9 dB |

TABLE 3-continued

| Harmonic fundamental | Fourier Integral 1V | FFT 1V |
| --- | --- | --- |
| 7th | −47.7 dB | −47.4 dB |
| THD | 0.905% | 1.414% |

Referring now to Table 3, there are shown Fourier coefficients of the first seven harmonics of the output signal shown in FIG. 4, as computed using the method of the present invention and using a fast Fourier transform (FFT) to compute the discrete Fourier transform. In order to obtain the THD value shown in column 3, the FFT process had to evaluate 512 harmonics. Fortunately, the FFT process is a reasonably efficient means for evaluating discrete Fourier transforms. FFT analyze based on narrower frequency ranges produced substantial error in the calculated Fourier coefficients due to aliasing. Comparable accuracy was obtained for the coefficients calculated with the method of the present invention employing only the first seven harmonics. This is possible because aliasing has been eliminated from the method of the present invention and undetermined harmonics have no impact on the Fourier coefficients of the frequencies of interest.

The FFT method for evaluating discrete Fourier transforms is not used unless the analysis can employ uniform sampling efficiently. For example, consider an RF mixer circuit having an input frequency of 2.7 GHz and an IF output frequency of 500 MHz. To determine the distortion of the mixer, the input signal is modulated at 1 MHz. In this circuit, the IF frequency is the 500$^{th}$ harmonic of the modulation frequency. The mixing of different frequencies creates sharp transitions that would require very small sampling intervals. This effectively precludes the use of uniform sampling and thus FFT. However, the method of the present invention may be applied with no loss of accuracy or efficiency.

TABLE 4

| Harmonic | RELTOL = $10^{-3}$ | RELTOL = $10^{-6}$ |
| --- | --- | --- |
| 496th | −81.7 dB | −93.1 dB |
| 497th | −60.0 dB | −68.2 dB |
| 498th | −52.1 dB | −53.3 dB |
| 499th | −6.06 dB | −6.05 dB |
| 500th | 56.2 dB | 56.3 dB |
| 501st | −6.05 dB | −6.05 dB |
| 502nd | −57.7 dB | −53.3 dB |
| 503rd | −63.9 dB | −68.4 dB |
| 504th | −77.4 dB | −98.1 dB |

Referring to Table 4, there is shown a calculation for the amplitudes of the four harmonics on either side of the IF frequency. Since aliasing is not a problem in the method of the present invention, Fourier coefficients need only be computed for the eleven harmonics of interest and the computation can be done efficiently. For example, the minimum interval employed during the analysis using the method of the present invention was about six times smaller than the average interval employed. In order to obtain comparable resolution, the FFT method would have to use the minimum interval throughout the analysis. Consequently, the analysis would take about six times longer.

Figure 5A:
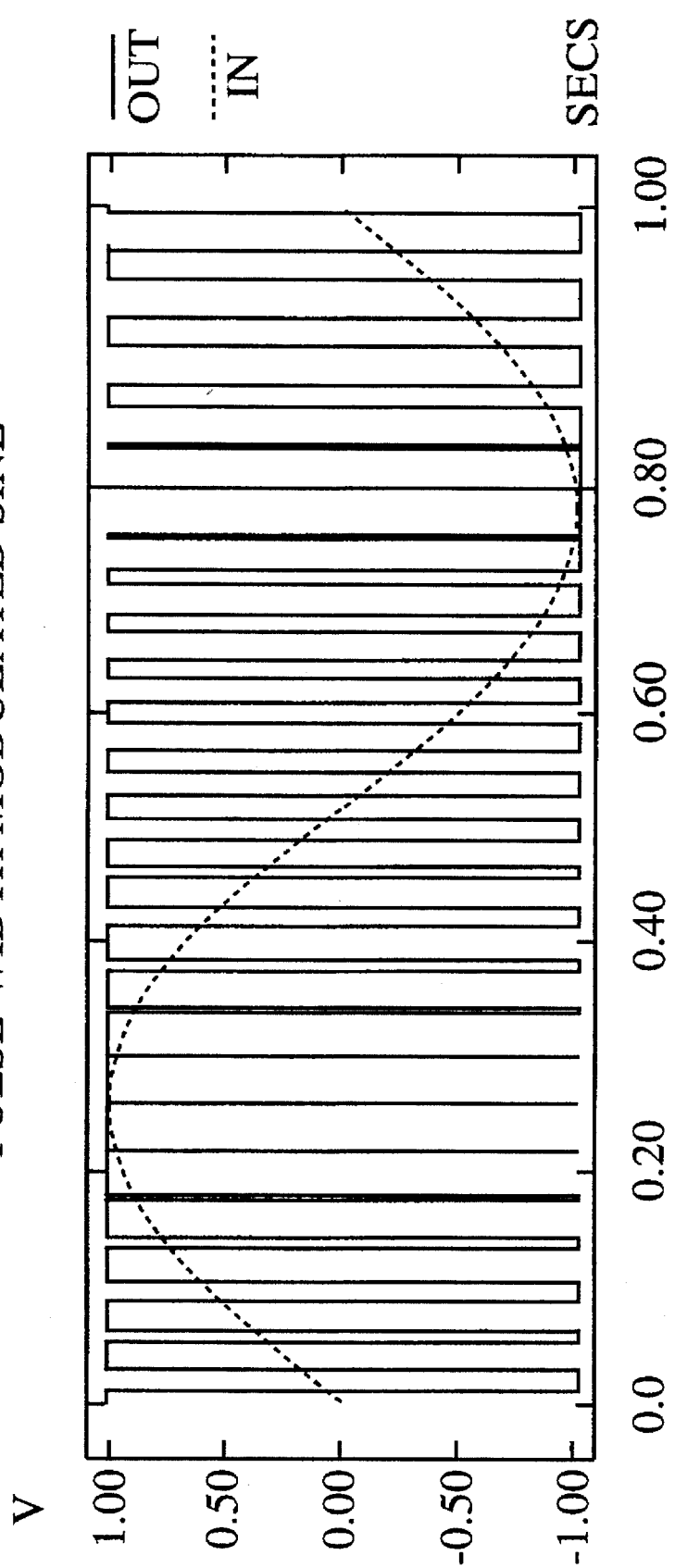
FIG. 5A and 5B are the output of a pulse width modulator and the results of a Fast Fourier Transform analysis of the output, respectively.
Figure 5B:
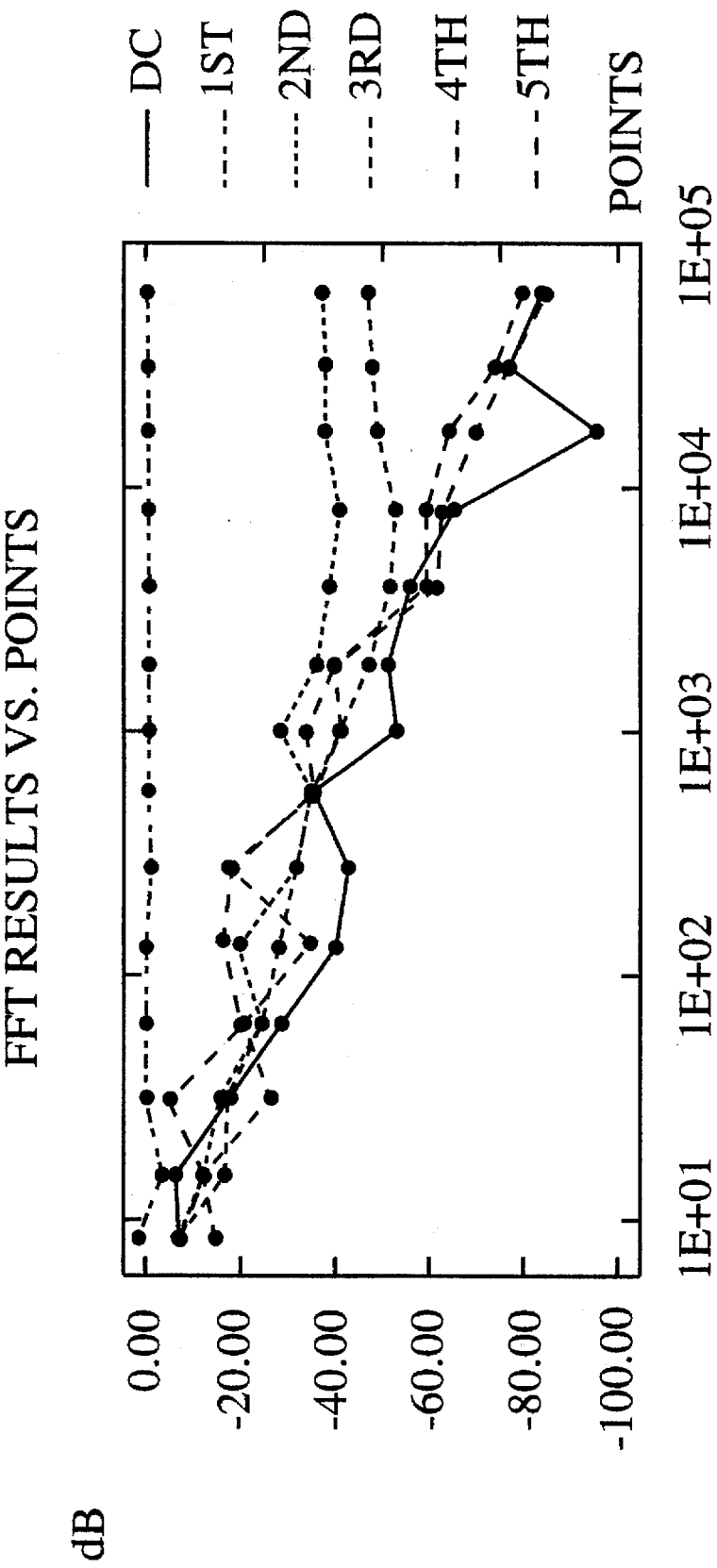

Referring now to FIG. 5A, there is shown the output of a pulse-width modulator operated at 25 pulses per period, where the width of the output pulses vary sinusoidally with time. Fourier analysis of the output waveform of a pulse-width modulator is difficult to perform efficiently and accurately with conventional DFT analyzers since the output switches from high to low states at arbitrary tintes, whereas the DFT can not resolve transitions that are shorter than the time interval width Δ. This is demonstrated in FIG. 5B, which shows the amplitude of the first through the fifth harmonics as a function of the number of data points analyzed. For example, it requires approximately $10^4$ data points to resolve the first and second harmonics accurately and the third, fourth, and fifth harmonics are still not resolved using more than $10^5$ data points. The number of points necessary to accurately resolve these harmonics increases as the number of pulses per period increases.

TABLE 5

| Harmonic fundamental | Fourier Integral 1V | FFT 1V |
| --- | --- | --- |
| 2nd | −48.1 dB | −48.0 dB |
| 3rd | −56.8 dB | −56.8 dB |
| 4th | −93.8 dB | −84.6 dB |
| 5th | 106 dB | −88.0 dB |
| 6th | −138 dB | −86.2 dB |
| 7th | −154 dB | −86.2 dB |
| 8th | −183 dB | −87.8 dB |
| 9th | −201 dB | −84.7 dB |

Referring now to Table 5, there is shown the results of Fourier analyses of a pulse-width modulator using the method of the present invention and using a 64K point FFT. As can be seen from the table, RFA 50 resolves the second through ninth harmonics more accurately than a FFT analysis done using a conventional DFT on 64,000 data points per period. Thus, despite a data base of almost $10^5$ points per pulse, the conventional DFT has failed to resolve the fourth through ninth harmonics. On the other hand, RFA 50 employing process 90 provides high resolution results using 575 data points.

Thus, a ratiometric Fourier analyzer has been presented for analyzing the frequency components of output waveforms with improved accuracy and efficiency. The ratiometric Fourier analyzer of the present invention samples values of the output waveform at time intervals selected in accordance with the properties of the waveform, generates a functional representation of the waveform from the sampled values, and uses the functional representation to analytically evaluate Fourier integrals over the corresponding intervals. The ratiometric Fourier analyzer eliminates errors in signal analysis due to aliasing as well as errors associated with approximating Fourier integrals by discrete Fourier series, and can be used to efficiently determine a small number of Fourier coefficients in broad band signals.

What is claimed is:

1. In a processor-controlled Fourier analyzer comprising a processor, a memory, and an input for receiving an output waveform of an electronic circuit, a processor implemented method for determining without aliasing errors a Fourier coefficient for a selected frequency of the output waveform, the method comprising the steps of:

sampling the output waveform at a first time;

detecting a value of the output waveform at said first time;

selecting a time interval for sampling the output waveform according to a curvature determined from a previous sample of the output waveform;

detecting a value of the output waveform following the selected time interval;

fitting a polynomial in powers of a time variable to the output waveform between adjacent detected values, the polynomial fit providing a plurality of coefficients, each of which is associated with a power of the time variable, for representing the output waveform over a continuous range of the time variable;

forming a product of each coefficient with a Fourier integral of an associated time variable of each coefficient over the selected time interval, at the selected frequency, and summing the products to obtain an amplitude representing a contribution of the selected frequency to the output waveform over the selected interval;

repeating the selecting, detecting a value of the output waveform following the selected time interval, fitting, and forming steps until the output waveform is fully sampled; and summing the amplitudes for each selected time interval to convert the polynomial representation of the output waveform into a Fourier coefficient representing the amplitude of the selected frequency in the output waveform, said Fourier coefficient having no aliasing errors.

2. The method of claim 1 wherein the polynomial is at least a second order polynomial in the time variable.

3. The method of claim 1, wherein the curvature of the output waveform is determined by the second derivative of the output waveform.

4. The method of claim 1 wherein the output waveform is the output waveform of an actual electronic circuit.

5. The method of claim 1, wherein the output waveform is the waveform generated by a circuit simulator.

6. The method of claim 5, wherein the step of detecting a value of the output waveform at the selected time interval comprises;

generating a new value for the output waveform with the circuit simulator at the selected time interval; and detecting the new value of the output waveform generated by the circuit simulator.

7. The method of claim 6, wherein the step of generating a new value for the output waveform with the circuit simulator comprises computing the output waveform produced by a circuit using a polynomial fitting procedure.

8. The method of claim 7, wherein the step of fitting a polynomial in powers of a time variable to the output waveform comprises fitting a polynomial of order equal to an order of the polynomial fitting procedure of the circuit simulator for generating values of the output waveform.

9. The method of claim 1 comprising the additional steps of:

detecting an input waveform to the electronic circuit;

determining the Fourier coefficient of the fundamental frequency of the input waveform; and calculating the ratio of the Fourier coefficients of the output waveform to the Fourier coefficient of the fundamental frequency of the input waveform.

10. The method of claim 1 wherein the step of selecting a time interval comprises the substeps of:

detecting a modulated output waveform from a circuit;

demodulating the modulated output waveform; and selecting a time interval for sampling the demodulated output waveform according to a curvature determined from a previous sample of the output waveform.

11. A Fourier analyzer for determining the Fourier coefficients of an output waveform generated by a source of electronic circuit waveforms, the Fourier analyzer comprising:

a detector coupled to the source of electronic circuit waveforms for detecting the output waveform generated by the source of electronic circuit waveforms when triggered by a selecting means;

selecting means coupled to the detector for monitoring detected values of the output waveform, determining a curvature of the output waveform from the monitored values, and triggering the detector at one or more time intervals determined by the curvature of the output waveform;

a waveform generator coupled to the detector to receive values of the output waveform detected at the selected time intervals and to generate a representation of the output waveform over each selected time interval as a polynomial in powers of a time variable, the polynomial for each selected time interval being characterized by a coefficient associated with each power of the time variable,;

an integrator coupled to the waveform generator for multiplying each coefficient in a selected time interval by a value equal to a Fourier integral of the associated time variable over the selected time interval and summing each product to provide a Fourier integral of the output waveform over the selected interval; and a coefficient generator coupled to the integrator for summing the Fourier integrals of the output waveform from each time interval to provide a Fourier coefficient for the output waveform.

12. The Fourier analyzer of claim 11, wherein the detector comprises a signal input coupled to receive the output waveform, a signal output coupled to the waveform generator, and a first processor implemented procedure resident in a memory of a processor, wherein the first processor implemented procedure triggers the detector to couple a value of the output waveform to the waveform generator when the feature of the output waveform occurs.

13. The Fourier analyzer of claim 11, wherein the waveform generator is a second processor-implemented procedure resident in a memory of a processor.

14. The Fourier analyzer of claim 11, wherein the integrator is a second processor-implemented procedure resident in a memory of a processor.

15. The Fourier analyzer of claim 11, wherein the coefficient generator is a third processor-implemented procedure resident in a memory of a processor.

16. A Fourier analyzer for determining the Fourier coefficents of an output waveform generated by a source of electronic circuit waveforms the Fourier analyzer comprising:

means for detecting the output waveform coupled to the source of electronic circuit waveforms, for detecting the output waveform when triggered by a selecting means;

selecting means coupled to the detector for monitoring detected values of the output waveform, determining a curvature of the output waveform from the monitored values, and triggering the means for detecting at one or more time intervals determined by the curvature of the output waveform;

means for generating a polynomial representation of the output waveform coupled to the detecting means, for generating a polynomial representation of the output waveform over each time interval from values of the output waveform provided by the detecting means;

means for evaluating a Fourier integral coupled to the means for generating a polynomial representation of the output waveform, for evaluating the Fourier integral of the polynomial representation of the output waveform over each selected time interval; and means for computing the Fourier coefficients of the output waveform coupled to the evaluating means, for computing the Fourier coefficients of the output waveform by summing the Fourier integrals from each time interval.

17. A computer readable storage medium on which is stored data for determining without aliasing errors a Fourier coefficient for a selected frequency of an output waveform of an electronic circuit, the data being suitable for implementation by a processor to perform the steps of:

sampling the output waveform at a first time;

detecting a value of the output waveform at said first time;

selecting a time interval for sampling the output waveform according to a curvature determined from a previous sample of the output waveform;

detecting a value of the output waveform following the selected time interval;

fitting a polynomial in powers of a time variable to the output waveform between adjacent detected values, the polynomial fit providing a plurality of coefficients, each of which is associated with a power of the time variable, for representing the output waveform over a continuous range of the time variable;

forming a product of each coefficient with a Fourier integral of an associated time variable of each Coefficient over the selected time interval, at the selected frequency, and summing the products to obtain an amplitude representing a contribution of the selected frequency to the output waveform over the selected interval;

repeating the selecting, detecting a value of the output waveform following the selected time interval, fitting, and forming steps until the output waveform is fully sampled; and summing the amplitudes for each selected time interval to convert the polynomial representation of the output waveform into a Fourier coefficient representing the amplitude of the selected frequency in the output waveform, said Fourier coefficient having no aliasing errors.

\* \* \* \* \*